United States Patent [19]

Zhu

[11] Patent Number: 5,701,074
[45] Date of Patent: Dec. 23, 1997

[54] SPECTRAL COMPONENT SEPARATION INCLUDING UNWRAPPING OF THE PHASE VIA A POISSON EQUATION UTILIZING A WEIGHTING MAP

[75] Inventor: Gang Zhu, Fort Collins, Colo.

[73] Assignee: Elscint Ltd., Haifa, Israel

[21] Appl. No.: 639,330

[22] Filed: Apr. 25, 1996

[51] Int. Cl.$^6$ .................................................. G01R 33/46
[52] U.S. Cl. ........................................................ 324/307
[58] Field of Search .................................. 324/307, 309, 324/318, 320, 300; 128/653.2–653.5

[56] References Cited

U.S. PATENT DOCUMENTS

| | | |
|---|---|---|
| 4,714,885 | 12/1987 | Paltiel et al. |
| 4,847,559 | 7/1989 | Keren . |
| 4,871,967 | 10/1989 | Rotem et al. |
| 4,902,973 | 2/1990 | Keren . |
| 5,432,447 | 7/1995 | Song ........................... 324/309 |

OTHER PUBLICATIONS

"Simple Proton Spectroscopic Imaging", by W. Thomas Dixon, *Radiology*, vol. 153, 1984, pp. 189–194.
"Two Point Dixon Technique for Water–Fat Signal Decomposition With B0 Inhomogeneity Correction", by Bernard D. Coombs et al., SMR, p. 647, 1995.
"Water–Fat Imaging With Three–Point Direct Phase Encoding", by Qing–San Xiang et al, SMR, p. 658, 1995.
"Robust Two–Dimensional Weighted And Unweighted Phase Unwrapping That Uses Fast Transforms And Iterative Methods", by Dennis C. Ghiglia et al., Journal Optical Society of America, vol. 11, No. 1, Jan. 1994, pp. 107–117.

*Primary Examiner*—Sandra L. O'Shea
*Assistant Examiner*—Roger Phillips
*Attorney, Agent, or Firm*—Greenblum & Bernstein P.L.C.

[57] ABSTRACT

A method of phase unwrapping by solving the Poisson equation using a weighted iterative algorithm, for use when separating spectral component with magnetic resonance imaging systems. The solution of the Poisson equation is expedited by using a weighting matrix obtained by calculating the average noise level of an in-phase image and using 3–5 times the noise level as a threshold with only pixel intensity levels above the threshold being set equal to one and the other pixels being set to zero. The pixels on the weight matrix are also set to zero according to the size differences of the phase offset per pixel either in the row or column direction. The solution of the Poisson equation is then uniquely operated on to remove a constant (bias) and to improve the fit.

7 Claims, 7 Drawing Sheets

SPECTRAL COMPONENT SEPARATION INCLUDING UNWRAPPING OF THE PHASE VIA A POISSON EQUATION UTILIZING A WEIGHTING MAP

FIELD OF THE INVENTION

This invention is concerned with Magnetic Resonance Imaging (MRI) systems and more particularly with the use of such systems to obtain separate images of different spectral components such as water and lipids. This represents another spectral component separation system in addition to the separation systems disclosed in U.S. Pat. Nos. 4,714,885; 4,847,559; 4,871,967 and 4,902,973 which are assigned to the assignee of this invention, and which are incorporated herein by reference.

BACKGROUND OF THE INVENTION

Separation of spectral components in MRI systems was given its initial impetus in an article appearing in radiology entitled: "Simple Proton Spectroscopic Imaging" by W. T. Dixon, volume 153, pp. 189–194 (1984). In that article, a method of encoding spectroscopic information into clinical images is explained. Subsequently, improvements and variations were made to the original Dixon procedure, as shown for example in the noted patents. In all cases the images produced differentiate between water and fat intensities. One of the methods basically requires using a normal spin-echo sequence in which the Hahn or spin echo and the warp or gradient echoes coincide. In addition, each excitation is repeated with the Hahn (spin) echo shifted by an appropriate interval. More particularly, the 180° RF pulse is shifted by a time T to shift the Hahn echo with respect to the gradient echo an amount sufficient to cause the chemical shift between the echoes of water and lipids to be 180° out of phase at the gradient echo time. The image produced with the described sequence clearly indicates the differences between the signals due to water and the signals due to fat.

By obtaining normal spin-echo derived image data in addition to obtaining modified spin-echo image data, two spectral images (water and lipid) can be constructed. Thus, the described methods enable imaging two spectral components in a single image, corrected for the chemical shift artifact or obtaining separate images of each of the two spectral components. The "Dixon" method and its derivatives work very well except where there are problems with inhomogeneity of the main field, which problems are ubiquitous. It is known, that the phase distortion caused by the inhomogeneity of the main field Bo can be calculated from the two scans obtained from the original Dixon method; For example see Coombs, B. D., et al SMR, P647 (1995). Another problem is that the required phase unwrapping technique used in many of the prior published spectral component separation methods are tedious, non-robust and unreliable when some phase offset is present. See, for example, the paper by Qing-San Xiang and Li An, SMR, P658 (1995). One of the reasons for the problems of the prior art phase unwrapping schemes is that they required too much user judgement and thus, lacked repeatability, reliability and robustness. Note that the terms phase, phase offset and phase distortion are used interchangeably herein. The term phase is represented by:

$$\phi = \pi W \, B/WCS \qquad (1)$$

where:
$\pi = 180°$

W B=frequency shift due to field inhomogeneity
WCS=chemical frequency shift

In a paper published in 1994 in the Journal "Optical Society o America" (Volume 2 No. 1 pp. 107–117), D. C. Ghiglia et al described a two-dimensional phase unwrapping scheme using fast discrete cosine transforms (DCT) and iterative methods. The phase-unwrapping of Ghiglia et al has not been used for phase unwrapping of Magnetic Resonance Images. It is a very complicated and time consuming procedure that appears to be too complicated and time consuming for practical use in clinical magnetic resonance imaging.

Accordingly, a broad aspect of the present invention is to provide a method and system for separating spectral images and accomplishing phase unwrapping during the production of the different spectral images.

Accordingly, it is another object of the present invention to acquire separate data contributions from first and second spectral components and for correcting the data for the phase wrapping that is due to the inhomogeneity of the field within the sample, as well as due to linear phase delays in a reliable and repeatable relatively simple manner. In accordance with the invention, the data may be acquired in sufficient quantities to construct an image of each of the spectral components, a combined image without chemical shift artifacts and/or a sample inhomogeneity map, with relatively simple, reliable and repeatable phase unwrapping.

BRIEF DESCRIPTION OF THE INVENTION

In accordance with the present invention, a method of using Magnetic Resonance Imaging (MRI) systems for acquiring separate data contributions and images derived from first and second spectral components is provided, the method comprises the steps of:

acquiring two complex images, a first of said two complex image including said first and second spectral components in-phase, a second of said two complex images including said first and second spectral components out-of-phase, generating a wrapped phase map, generating a weighting map, unwrapping the phase of the wrapped phase map to provide an unwrapped phase map, said step of unwrapping the phase comprising the steps of:
   solving the Poisson equation to derive the unwrapped phase,
   using the unwrapped phase to correct the phase of the complex image with the spectral images out of phase,
   using the image with the corrected phase to obtain a plus image and a minus image, and
   distinguishing between the plus and the minus images to determine which is an image of the first spectral component and which is an image of the second spectral component.

A further feature of the invention comprises a method of unwrapping phase in images acquired in MRI of spectral components including the steps of:

generating a wrapped phase map, generating a weighting map to discard noisy and wrapped phase pixels in the images, correcting the phase in images acquired, generating plus and minus images, and identifying the plus and minus images as first and second spectral component images.

Yet another feature of the invention comprises a method for unwrapping phase for use in magnetic resonance imaging systems that acquire images of first and second spectral components, said method comprising the steps of:

providing an in-phase image and an out-of-phase image with the in-phase image having the first and the second spectral components in phase and the out-of-phase image having the first and the second spectral components out of phase, generating a wrapped phase map using the in-phase and the out-of-phase images to show the phase offset per pixel caused by main static magnetic field (Bo) inhomogeneity, performing phase unwrapping by solving the Poisson equation to provide an unwrapped phase plus a constant/pixel, said performing step including:
using a weighted iterative algorithm,
setting up a weighting map based on signal-to-noise ratio and phase differentiation of the phase map,
acquiring a true unwrapped phase map by removing the constant and better fitting the unwrapped phase map,
using the true unwrapped phase to obtain a phase corrected complex image with the first and second spectral components out of phase,
obtaining a plus image by adding the phase corrected image and the in-phase image,
obtaining a minus image by subtracting the phase corrected image from the in-phase image, and
determining which image of the plus and the minus image is the image of the first spectral component.

A related feature of the invention comprises combining the minus image and the plus image to obtain an image free of inhomogeneity and chemical phase shift artifacts.

Another feature of the invention is the use of the method with the first and second spectral components being lipid and water respectively.

Yet another feature of the invention includes positioning the 180° RF pulse to cause a 180° phase difference between the data contributions of the first and second spectral components in one of the echoes.

Still, yet another feature of the invention comprises positioning the 180° Rf pulse to cause a 0° phase difference between the data contributions of the first and second spectral components in the other of the echoes.

Yet a further feature of the invention assures that no phase angle discontinuities (jumps of over essentially 360°) occur in an inhomogeneity map obtained from the images of the original first and second spectral components.

BRIEF DESCRIPTION OF THE DRAWINGS

The objects and features of the present invention will be best understood when considered in light of the following description of a broad aspect of the invention taken in conjunction with the accompanying drawings; wherein:

FIG. 6($b$) illustrates ideal unwrapping;

FIG. 6($c$) illustrates that when a "good" region is found, the phase difference is calculated;

FIG. 6($d$) shows the true phase offset when the "bias" or constant is removed.

GENERAL DESCRIPTION

Figure 1:
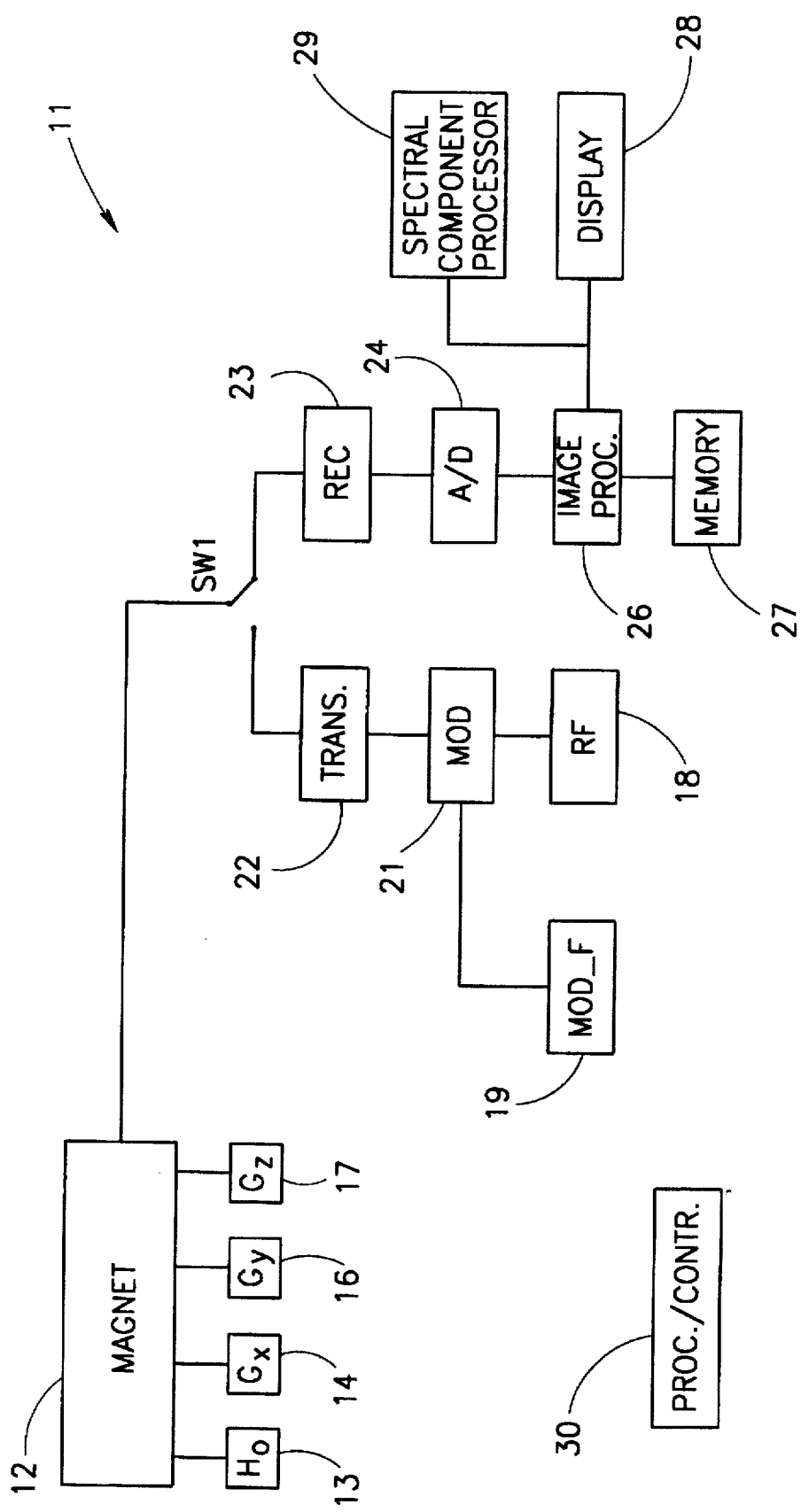
FIG. 1 is a block diagram showing of a typical magnetic resonance data acquisition system.

FIG. 1 generally shows an MRI system 11 for use in acquiring data and providing images using magnetic resonance principles. The system includes a large static magnet 12 into which a patient (or sample) is placed. The static magnetic field can be generated using electro magnets, permanent magnets or super-conducting magnets within the scope of this invention. In a preferred embodiment the super-conducting magnet is used. The energization of the super-conducting magnet is indicated at 13 by the magnetic field generator Ho.

Means are provided for locating the source of signals received in the MRI system. More particularly, gradient fields are applied to the static magnetic field Bo generated by Ho. These gradients are applied in X,Y, and Z orthogonal coordinates. Gradient generators are indicated at blocks 14, 16 and 17 labeled GX, GY and GZ, respectively. The gradients are used to vary the magnetic fields along the X,Y and Z axes and thus provide slice selection, phase encoding and read-out or view selection functions.

The large static magnetic field causes an alignment of certain nuclear spins in the sample (or patient). Means are provided subsequently for tipping or perturbing the aligned spins by applying radio-frequency pulses at the Lamor frequency of the particular nuclei being perturbed or nutated.

The Lamor frequency is:

$$fl = \gamma Bo/2\pi \qquad (2)$$

where:

γ is the gyro magnetic constant for the isotope whose nuclei is perturbed,

π is the constant 3.1416, and

Bo is the strength of the static field at the location of the nuclei.

The RF pulse is generated in the RF generator 18. The pulse may be shaped by modulating it with shaped signals generated at modulation signal generator 19. The shaped signals and the RF pulses are applied to the modulator 21. The modulated shaped RF pulses are then transmitted by the transmitter amplifier 22 through switch SW1 to RF coils (not shown) in the main magnetic assembly 12. It should be understood for the purposes of this inventions it is not necessary to shape the Rf pulses.

In echo sequences, after a passage of a set amount of time from the end of the Rf pulse, echo signals are generated. The echo signals may be Hahn echo and gradient echo signals, or just gradient echo signals with appropriate phase differences between the spectral components. The echoes are received by the receiver 23 using either the same Rf coil used during transmission or using separate RF pickup coils. In either case, the RF signals are amplified and digitized by the analog-to-digital circuitry indicated at 24. The amplified digitized signal may be processed in processor 26 in conjunction with memory means 27 to obtain pixel values for images for display on monitor 28.

In accordance with this invention a spectral component and an inhomogeneity map processor 29 is provided. The processor 29 uses the pixel values to obtain spectral component values per pixel and/or inhomogeneity values per pixel. The spectral component processing and inhomogeneity processing is sometimes referred as "spectral component processing".

The acquisition image processing and spectral component processing operations are under the control of processor controller 30. The processor controller 30 provides the control signals and time sequences for the particular scan sequence used in acquiring data, for example. It controls all the blocks shown and thus is connected to each of the blocks. To avoid confusion, the buses between the processor controller 30 and the other blocks are not shown.

When acquiring data for images using hydrogen protons, for example, artifacts are often generated because of what are known as chemical shifts. The chemical shifts are caused by differences in the resonant frequency of the hydrogen nuclei attached to different molecules. For example, hydrogen attached in a water molecule has a slightly different Lamor frequency than hydrogen in a lipid molecule. The differences in frequencies are to the chemical shifts produce spatial shifts which cause artifacts in the images. However, the chemical shift can also be used to obtain additional data such as, for example, data which quantifies the amount of fatty substances in body tissue and thus the additional data can be useful.

Figure 2:
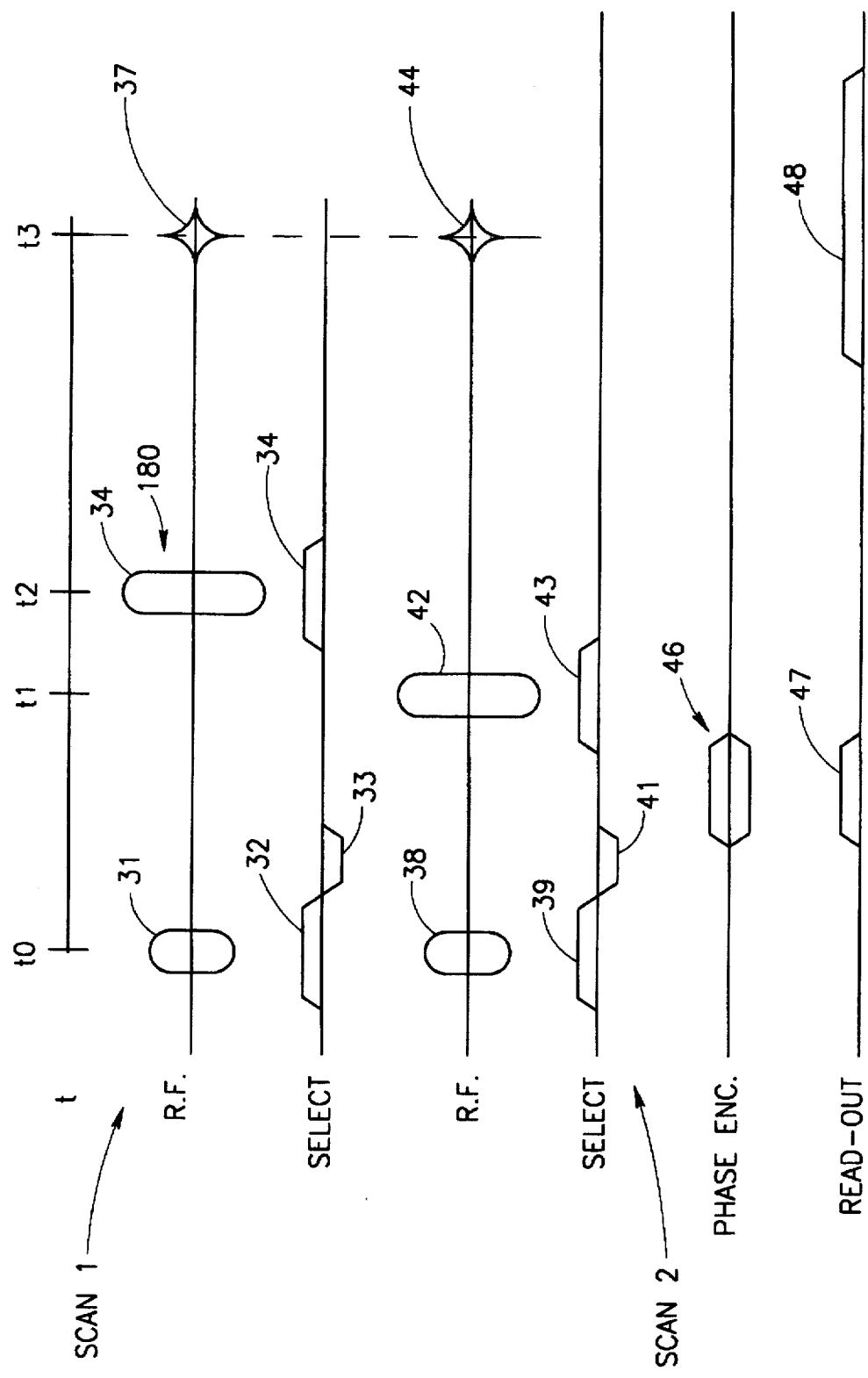
FIG. 2 is a showing of the spin echo data acquisition sequence as described herein for obtaining imaging data of two spectral scans.

FIG. 2 shows a sequence wherein data from both first and second spectral components-and an inhomogeneity map can be obtained in a pair of scans. This is done by shifting the 180° RF pulse by an amount sufficient to assure that the first and second spectral components are 180° out of phase. More particularly in FIG. 2 it is seen that the first RF pulse 31 is applied at time t$\phi$ during the application of a select gradient pulse 32. A dephasing portion 33 of the select gradient pulse 32 is also used as shown. The second Rf pulse 34, that is the 180° RF pulse, is applied at time t2. during the application of the select gradient pulse 36. At time t3 an echo is produced, as shown at 37. The time t3 is equal to twice the time t2.

In a second scan, the 90° RF pulse 38 is applied at the time t$\phi$ again during a select gradient pulse 39 having a dephasing portion 41. In this scan, the 180° RF pulse 42 is applied at a time t1. The times t2–t1 is equal to 1.1 millisecond where the static magnetic field is 1.5 Tesla. Therefore In this scan the echo is delayed after t1 by 2.2 milliseconds and the signals from the water and the fat are exactly out of phase.

FIG. 2 also shows a select gradient 43 applied during the application of the 180° scan 2 pulse. The echo 44 is in the same location at t3 as the echo 37 because the rephase gradient is not changed. FIG. 2 also shows the phase encoding pulses 46 applied to both scans and the readout pulses 47 and 48 applied to both scans. The readout pulse 47 is applied prior to the 180° RF pulses so as to cause the gradient echo to occur at the same time as the Hahn echo. This is done, of course, by assuring that the area under the pulse 47 is equal to half the area under curve 48. In the first scan, signals from the water and fat are in the same phase at the echo time t3. In the second scan the signals from water and lipid are 180° out of phase. Thus, these two scans provide two spectral images S1 and S2. In image S1 the signals from the two different spectral components are in phase. In image S2, the signals from the two different spectral components are 180° out of phase. The sequence of FIG. 2 is merely shown as one exemplary sequence for obtaining two spectral images. Within the scope of the invention other sequences can be used.

The image processor 26 provides the complex images S1, S2 and in addition, the Bo inhomogeneity image of the static magnetic field as described, for example, in the noted Coombs et al article.

Figure 3:
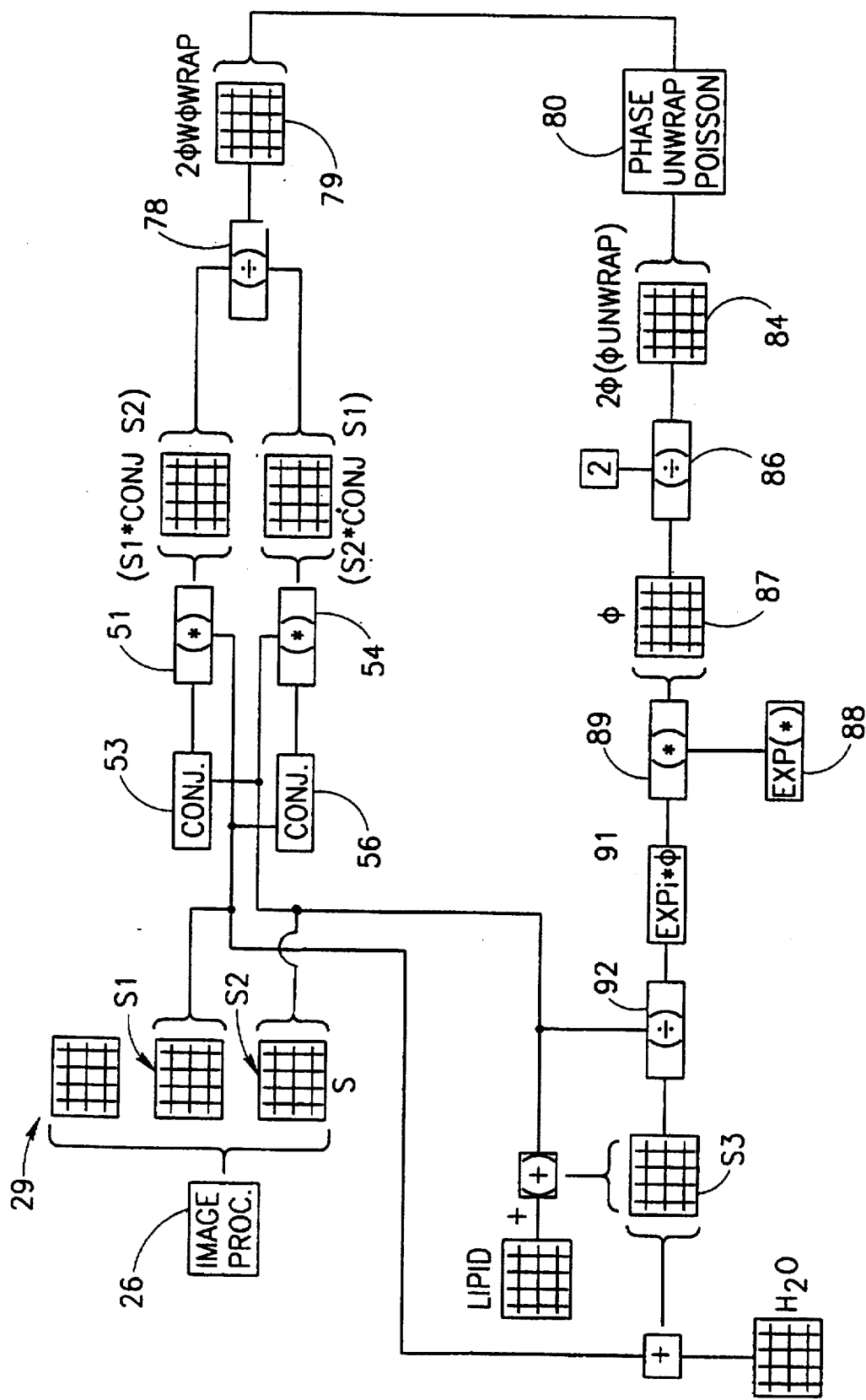
FIG. 3 is a block diagram showing of details of the spectral component processor of FIG. 1.

FIG. 3 is a block diagram showing of how the two images S1 and S2 are used to provide the complex images of two separate spectral components. More particularly, the image processor 26 is shown as feeding into the spectral component processor 29. Details of the spectral component processor indicate how the two images S1 and S2 are operated on by the spectral component processor. The image S1, for example, is convolved with the conjugate of image S2. Thus, the image S1 is shown as providing data to a convolver 51. At the same time, the conjugate of image S2 is provided by conjugator 53 to the convolver 51. A matrix of image data S1* Conjugate (S2) is provided. Similarly, the data from the image S2 is provided to a convolver 54; while, the conjugate of the image S1 is provided to convolver 54 by the conjugator 56. The convolver 54 thus convolves image data of image S2 with the conjugate of the image data of the image S1 to provide a matrix of data for the image S2* conjugate (S1).

Figure 4A:
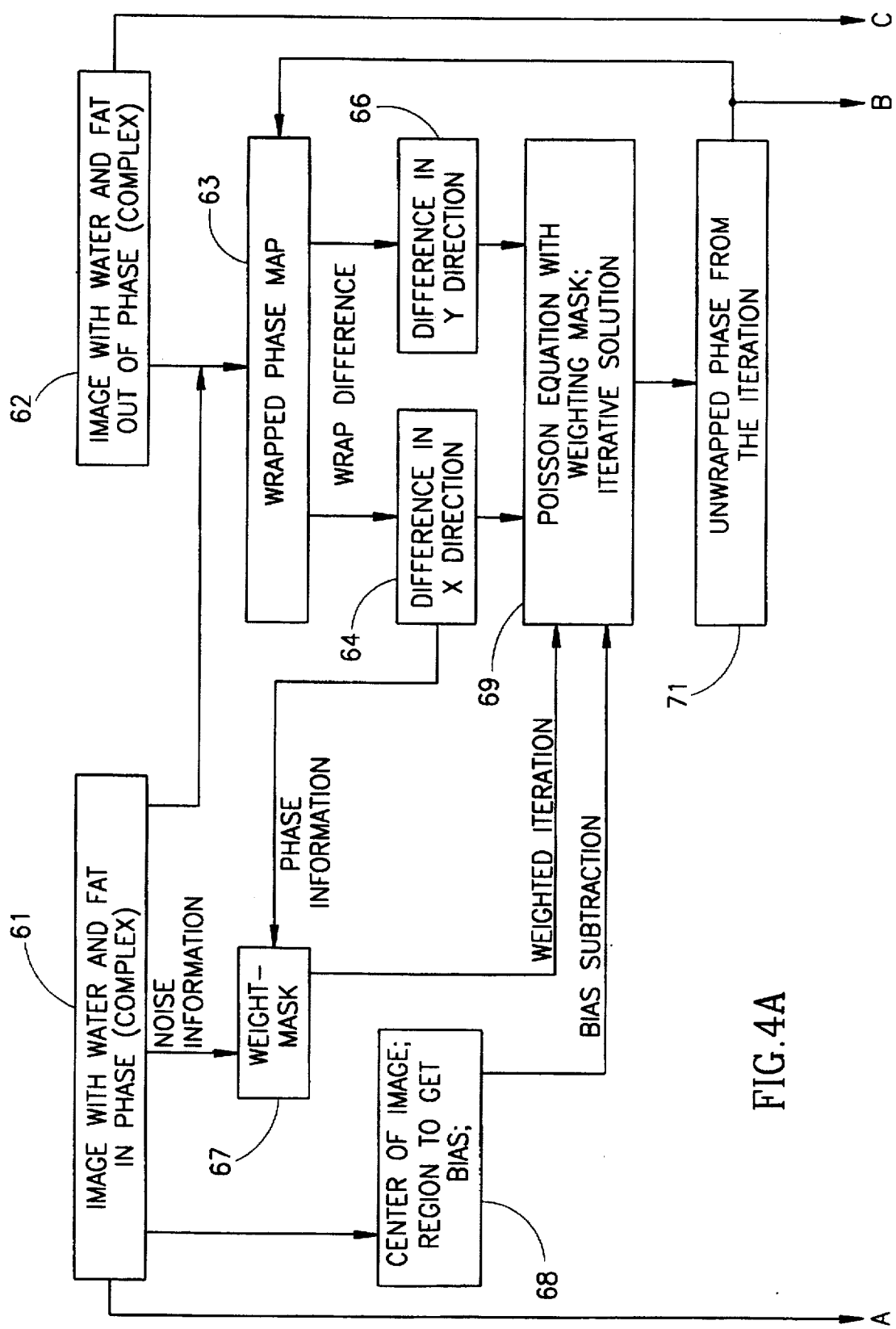
FIGS. 4A and 4B are a flowchart showing processing used to acquire the images of the two spectral components with robust phase unwrapping.
Figure 4B:
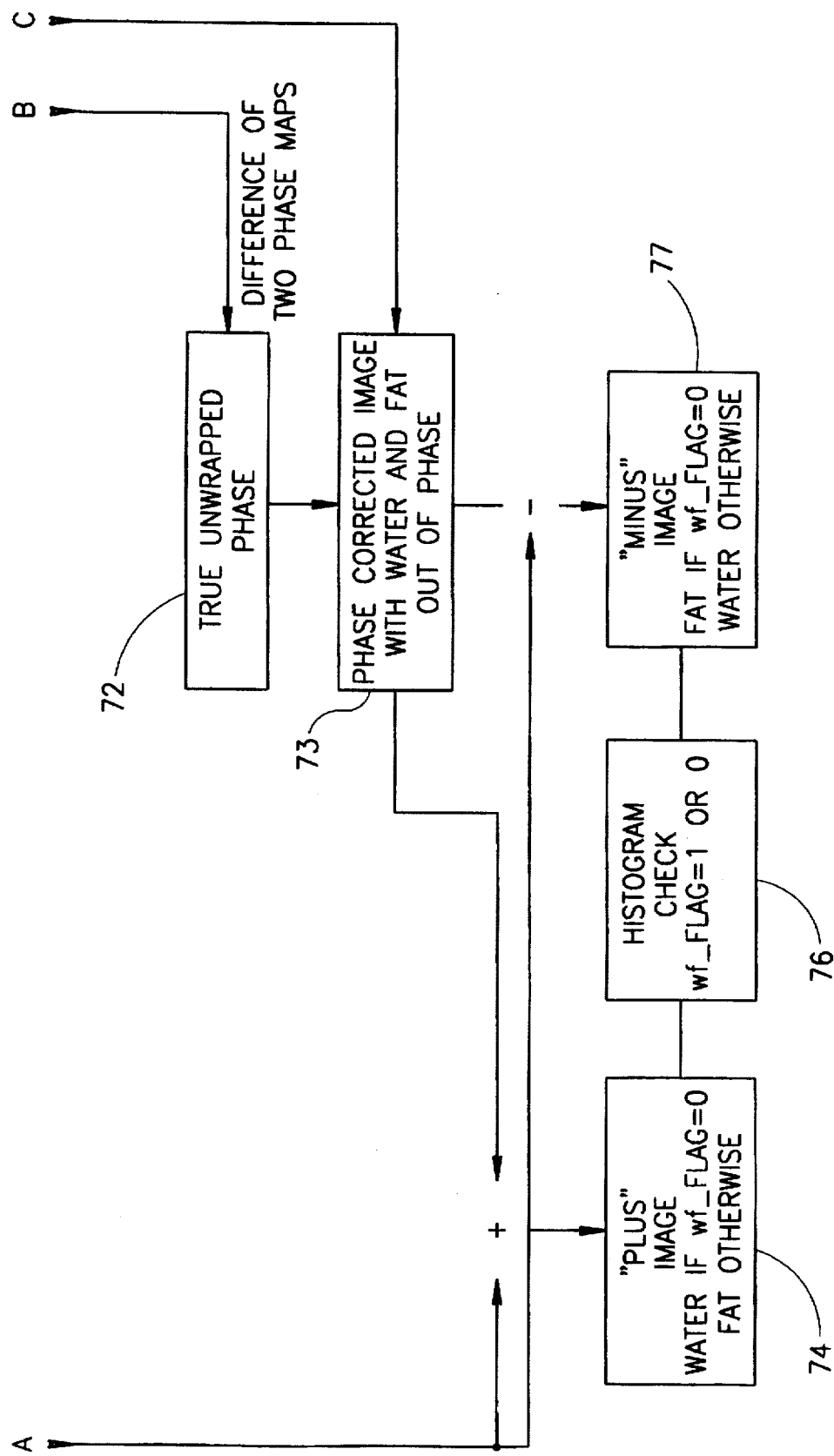

Turning now to the flow diagrams of FIGS. 4A and 4B, the broad operation of invention will be explained. The image S1 is indicated at block 61. The image S2 is indicated at block 62. The data from the image S1 and image S2 is combined to obtain a wrapped phase $\phi$ map shown at block 63. The wrapped phase differences are obtained from block 63 both in the X direction (columns) as shown by block 64 and in the Y direction (rows) as shown by block 66. The noise information of the image S1 is used to provide a weight mask shown at block 67. The average noise level of the image is computed. Three to five times the average noise level is used as a threshold. When the water and fat are in phase as in image S1, then pixels having intensity levels greater than the threshold are given a value of one in the weight-mask. All other pixels have a "0" value. The weight mask pixels are also of zero value if the pixel to pixel difference either in the X or in the Y direction is greater than another threshold which is determined by the maximum Bo inhomogeneity. In the exemplary system it is set to be 0.6 to 1.5 radians.

The intensity and phase information from the weight mask are combined to set up and iteratively solve the Poisson equation as shown at block 69. The solution of the Poisson equation provides the unwrapped phase. However this unwrapped phase is biased by a constant. To get the true unwrapped phase it is necessary to remove the bias.

The center of the image region of image S1 is examined to determine the bias as shown at block 68. Bias subtraction is provided to block 69 from block 68.

The solution of the Poisson equation provides an unwrapped phase per iteration as shown at block 71. Iterations are continued until a true unwrapped phase is provided as shown in block 72 using the wrapped phase maps 63 and the unwrapped phase map 71. The true unwrapped phase is obtained using the difference of the two phase maps. The true unwrapped phase is used to correct the phase, pixel-by-pixel in the image S2 to provide a phase corrected image 73 with first and second spectral components out of phase.

What is called the plus (+) image 74 is obtained by adding image S1 and the image of block 73. A minus (−) image 77 is obtained by subtracting image S1 and the image of block 73. A histogram is obtained as shown at 76. The + image is water if the histogram indicates that the plus image provides Wf_flag equals 0. In other words fat is indicated by a higher intensity than the water image.

Returning now to FIG. 3, the S1*conjugate (S2) image is divided by the S2*conjugate (S1) image as shown by the division block 78. The quotient is the phase wrapped Bo inhomogeneity image −2φ shown at 79.

Image 82 is unwrapped using the Poisson equation explained in greater detail further herein but presently indicated at block 80. The −2φ phase unwrapped image is indicated at 84. It is divided by 2 at block 86 to provide the phase unwrapped image 87. The phase unwrapped image is convolved with the exp (i) as indicated at blocks 88 and 89 to obtain the exp (−i*φ) image indicated at block 91. The exp (−i*φ) image is convolved with the S2 image as indicated at block 92 to provide an S3 image which is the phase corrected S2 image. The S3 image is then added to the S1 image to provide a plus image and is subtracted from the S1 image to provide a minus image. The plus and minus images are each of a different spectral component. These images, are tested with a histogram to determine whether they are images of the first spectral component or of the second spectral component such as, for example, water and lipid as indicated in FIG. 3.

Using the Poisson equation, with the weighted iterative phase unwrapping procedure provides a reliable unwrapping. After the unwrapping, −2*φ true is obtained. The phase of S2 is corrected by exp (−i*φ true). Then, the first spectral component is W=S1+S2 exp(−i*φ true) and the second spectral component is F=S1−S2 exp (−i*φ true).

A weighting mask or map is used in the phase unwrapping procedure. More particularly, in solving the Poisson equation on a two dimensional discreet grid, not all pixels are needed to get the solution. The bad pixels—that is, pixels with a large phase distortion or a pixel value with a low signal to noise level—are not used in performing the phase unwrapping. For example, using a 256×256 image, a weighting matrix is created with 256×256 pixels. The value 1 is set for the pixels which correspond to the good intensity pixels in S1 and for the good phase pixels in the wrapped phase map (79 in FIGS. 3 and 63 in FIG. 4A). The bad pixels (either too noisy or having a wrapped phase) are given a zero value. In accordance with this invention a pixel is judged to be good by using 4×4 submatrices in the in-phase complex image S1 to test the signal to noise ratio and 4×4 sub matrices in the wrapped phase map to test the phase distortion.

In general, the average noise level of the image is calculated. A threshold is set at 3–5 times the average noise level. All pixels having signals greater than the threshold cause the weighting matrix pixel to be set to "1". The other pixels are set to "0". The weighting matrix pixels that correspond to pixels of the wrapped phase map where the difference between successive pixels is greater than 0.6 to 1.2 radians either in the row direction or in the column direction are set to zero.

The solution of Poisson's equation with the weighting mask results in an unwrapped phase map but it includes a constant and also because of fitting problems it may not be good enough to correct for phase distortion. What is needed in the true unwrapped phase (block 72 of FIG. 4B).

In general after solving Poisson's equation the following procedure is followed to obtain the true unwrapped phase in a set number (10) of iterations or less:

(a) The mean intensity value of the image S1 is calculated by averaging the magnitude of the intensity of the pixels with the weighting matrix.

(b) The row and column indicies of the intensity weighted geometrical center of the image S1 is found.

(c) The center is taken as a pivot point in the wrapped phase map 63. Then the maximum and minimum intensity of the pixels, the maximum and minimum value of phase in a region (a 4×4 sub-matrix in image S1) which contains the pivot is calculated.

The following conditions are then tested to determine:

(1) whether the mean intensity of this region is bigger approximately than 0.3 of the mean intensity calculated in step (a)

(2) whether the range of maximum and minimum value is less than 0.5 of the mean intensity calculated in step (a), and (3) whether the range of maximum and minimum phase values is less than π. This ensures that there is no phase wrap in this region.

Figure 5:
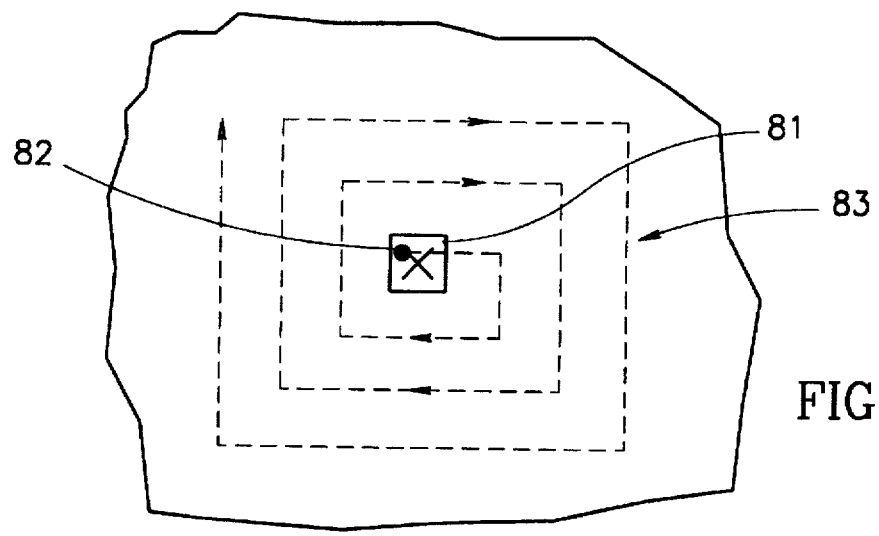
FIG. 5 pictorially illustrates spiralling out the intensity weighted geometrical center in succeeding submatrices in a simplified method of removing a constant obtained when solving the Poisson equation.

If all these conditions are met, this region is taken to do the bias calculation. Otherwise, the pivot point is spiraled outside the 4×4 sub-matrix and the next sub-matrix is considered as shown in FIG. 5. Each of the procedures 1–3 are repeated for each of the sub-matrices until a sub-matrix is found that meets the conditions. When the sub-matrix is found, then the mean phase difference between this sub-matrix and the corresponding sub-matrix in the unwrapped phase map is found, then this difference is subtracted from each phase pixel in the unwrapped phase map −2φ.

(4) if the unwrapping is perfect, the difference between the wrapped phase and the unwrapped phase can only be 2nπ; where: n is an integer. Since perfection is not expected with less than ten iterations, the phase difference between the wrapped phase and the unwrapped phase is compared pixel by pixel. If the differences are between (n−1)π to (2n+1)π, the unwrapped phase is assigned to the wrapped phase plus 2nπ. Therefore, the phase difference between the wrapped and unwrapped phase can only be 2nπ which is exactly expected from the unwrapping procedure. The unwrapped phase is then used to correct the phase pixel by pixel in the complex image with the water and fat out of phase. These steps are shown in block 71, 72 and 73 of FIGS. 4A and 4B.

The intensity weighted geometrical center of the image is like the gravitational center of an object. It calculates as follows:

$$R = \frac{\sum_{i,j=1}^{M} I_{i,j} \cdot i}{\sum_{i,j}^{M} I_{i,j}} j \qquad C = \frac{\sum_{i,j=1}^{N} I_{i,j} \cdot j}{\sum_{i,j=1}^{N} I_{i,j}} i$$

where: Iij is the intensity of the in-phase complex image (S1) at ij position, i is the row index, j is the column index, M×N is the image matrix size, R,C is the row and column index respectively for the intensity weighted geometrical center.

Note that the arbitrary constant of the solution of Poisson's equation is the bias noted in block 68 of FIG. 4. The bias is subtracted from the entire unwrapped phase map found by solving the Poisson equation. The mathematical basis for phase unwrapping is shown as follows:
Setting up the Poisson equation:

Assuming the unwrapped phase map is φ, which is also a M×N 2D matrix. i,j and φi,j are the elements of the matrices ψ and φ respectively. k is an integer matrix and k are the elements of k matrix. i and j are the column index and the row index of the matrices respectively. Thus:

$$\phi_{i,j} = \psi_{i,j} + 2\pi k_{i,j} \quad (3)$$

and $$-\pi < \psi_{i,j} < \pi,$$

i=0,1 ... N−1, j=0,1 ... N−1

For simplicity, a wrapping function Wf is defined as:

$$Wf(\phi_{i,j}) = i,j \quad (4)$$

Eq. (4) shows that the Wf function will make φi,j into i,j by only plus or minus 2k π, and the value of i,j will be between −π and π.

The wrapped phase differences in the two directions including Neumann boundary condition (edges of the matrices) can be expressed as $$\Delta_{i,j}^x = Wf(\psi_{i+1,j} - \psi_{i,j})$$

for i=0, 1 ... N−2, j=0, 1 ... N−1.

$$\Delta_{i,j}^x = 0, \text{ otherwise (edges)};$$

$$\Delta_{i,j}^y = Wf(\psi_{i,j+1} - \psi_{i,j})$$

for i=0, 1 ... N−1, j=0, 1 ... N−2.

$$\Delta_{i,j}^y = 0 \text{ otherwise (edges)}; \quad (5)$$

where x,y indicate the row or column differences.

The unwrapped phase map φi,j that minimizes the following summation to get the best fit for the unwrapped phase difference and the wrapped phase difference.

$$SUM = \sum_{i=0}^{M-2} \sum_{j=0}^{N-1} (\phi_{i+1,j} - \phi_{i,j} - \Delta_{i,j}^x)^2 + \sum_{i=0}^{M-1} \sum_{j=0}^{N-2} (\phi_{i,j+1} - \phi_{i,j} - \Delta_{i,j}^y)^2 \quad (6)$$

where M and N are the sizes of the matrices.
From $$\frac{\partial Sum}{\partial (\phi_{i,j})} = 0$$

the following simple equation is obtained:

$$\phi_{i+1,j} + \phi_{i-1,j} + \phi_{i,j+1} + \phi_{i,j-1} - 4\phi_{i,j} = \Delta_{i,j}^x - \Delta_{i-1,j}^x + \Delta_{i,j}^y - \Delta_{i,j-1}^y \quad (7)$$

Equation 7 gives the relationship between the wrapped phase differences calculated from equations 5 and the unwrapped phase map values φi,j to be solved.
Equation 7 can be written as:

$$(\phi_{i+1,j} - 2\phi_{i,j} + \phi_{i-1,j}) + (\phi_{i,j+1} - 2\phi_{i,j} + \phi_{i,j-1}) = \rho_{i,j}$$

where $$\rho_{i,j} = \Delta_{i,j}^x - \Delta_{i-1,j}^x + \Delta_{i,j}^y - \Delta_{i,j-1}^y \quad (8)$$

It is clear that equation 7 is a discretization of Poisson equation on a rectangular M×N grid.

$$\frac{\partial^2}{\partial x^2} \phi(x,y) + \frac{\partial^2}{\partial y^2} \phi(x,y) = p(x,y).$$

So far a relationship has been established between the wrapped phase differences (in both column and row directions) and the unwrapped phase map φ which needs to be solved.

Generating the weighting mask:

First create a matrix WT with the same size as the wrapped phase map matrix. Assign all elements to the same value 1. Secondly take the absolute value image of S1 i.e. Io=|S1| Take four 4×4 sub matrices at the four corners of I0. Then get the mean values of all sub-matrices. Take the smallest value No of the four means values as the noise level. (There is an assumption to use this invention, i.e. at least one area with 4×4 pixels (a 4×4 sub matrix) at one corner of the image is assumed free of any real signals) In MRI, this is usually satisfied. Take To=3No as a threshold. Make the element value 0.0001 in the weighting mask if the corresponding element in Io is smaller than this To. This will eliminate the noise region from the fitting procedures.

Solving the Poisson Equation:

The Poisson equation can be solved using the following procedures:

(a) calculate $\Delta_{i,j}^x$ and $\Delta_{i,j}^y$ from the measured wrapped phase map using equation (5) and calculate $\rho_{i,j}$ from $\Delta_{i,j}^x$ and $\Delta_{i,j}^y$ using eq. (8).

(b) the main iterative calculation:

1) set k=0, φ=0, and r=.

$$\min(WT_{i-1,j}^2, WT_{i,j}^2)\Delta_{i,j}^x - \min(WT_{i,j}^2, WT_{i-1,j}^2)\Delta_{i-1,j}^x$$

where $c_{i,j}=$ $$+\min(WT_{i,j+1}^2, WT_{i,j}^2)\Delta_{i,j}^y - \min(WT_{i,j}^2, WT_{i,j-1}^2)\Delta_{i,j-1}^y$$

where min(A,B) means the minimum value in A and B.

Here we introduce a notation for the later use.

c=Qψ for the above $c_{i,j}$ calculation.

2) while $r_k \neq 0$, solve $P z_k = r_k$ (i.e. from $r_k$ to $z_k$) using the following procedures:

(a) perform the 2D forward DCT of the array of values, $(r_k)_{i,j}$ using the following formula:

$$(\bar{r}_k)_{mn} = \sum_{i=0}^{M-1} \sum_{j=0}^{N-1} 4(r_k)_{i,j} \cos\left[\frac{\pi}{2M} m(2i+1)\right] \cos\left[\frac{\pi}{2N} n(2j+1)\right]$$

where:

0≤M≤M−1; 0≤n≤N−1

0 otherwise (b) calculate $W_{z_k}$ using the following formula:

$$(\bar{z}_k)_{i,j} = \frac{(\bar{r}_k)_{i,j}}{2\left(\cos\frac{\pi i}{M} + \cos\frac{\pi j}{N} - 2\right)} \quad (9)$$

(c) perform the 2D inverse DCT of $W_{z_k}$ to obtain $z_k$ using the following formula:

$$(z_k)_{m,n} = \frac{1}{MN} \sum_{i=0}^{M-1} \sum_{j=0}^{N-1} WW_{m,n}(-z_k)m,n \cos\left[\frac{\pi}{2M}(2i+1)\right] \cos\left[\frac{\pi}{2N}n(2j+1)\right]$$

where:

$0 \leq i \leq M-1$, $0 \leq j \leq N-1$ 0 otherwise where

WW is a matrix with the definition of $WW_{o,o} = 0.25$, $WW_{o,j} = 0.5$, where $0 < j < N-1$ $WW_{i,o} = 0.5$, where $0 < i < M-1$ otherwise $WW_{i,j} = 1$ for all $i > 0$ and $j > 0$. Note: WW is different from WT (the weighting matrix).

Also k=k+1, where k is the iteration index

If k=1, $p_j=z$

If k>1, then:

$\beta_k = \underline{r}_{k-1} \gamma \underline{z}_{k-1}/(\underline{r}_{k-2}\gamma \underline{z}_{k-2})$ $\underline{P} = \underline{z}_{k-1} + \beta_k \underline{P}_{k-1}$ The underlined variables are vectors (matrix). $\beta_k$ is a scalar·$\underline{r}_{k-1}$ is the transpose of the vector $\underline{r}_{k-1}$. Then $\underline{r}_{k-1}\gamma \underline{z}_{k-1}$ is the scalar product of the two vectors. The same for the denominator.

The following calculation is performed to obtain the next iteration result.

$\alpha_k = \underline{r}_{k-1} \gamma \underline{z}_{k-1}/\underline{P} \, Q \, \underline{P}_k$ $\phi_k = \phi_{k-1} + \alpha_k \underline{P}_k$ $\underline{r}_k = \underline{r}_{k-1} - \alpha_k Q \, \underline{P}_k$ The $\alpha_k$ is a scalar·$Q \, \underline{P}$ is defined the same way as $c=Q\psi$·r remains after k iteration and the $\phi k$ is the solution after k iterations.

If k<number of iteration specified, do next iteration.

Finally the unwrapped phase map is arrived at within ten iterations.

The output phase map $\phi k$ is the Poisson equation solution. It is a best fit for the wrapped phase difference and the unwrapped phase difference after the kth iteration. However, because it is the best fit of the phase difference, not the phase itself, there is an arbitrary constant difference between the wrapped phase and the unwrapped phase. The true unwrapped phase is then derived as previously explained.

The procedure for acquiring the true unwrapped phase map insures that no phase wrap or noise is present in the submatrix used in finding the bias introduced by the solution of the Poisson equation. The bias is subtracted from the entire unwrapped phase map.

FIG. 5 shows how the search for the good region is conducted. It starts from the intensity weighted geometrical center 81 containing the pivot point 82. If the first submatrix fails to meet the condition, then the next submatrix is selected and tested. The search continues in the spiral like path 83.

Figure 6A:
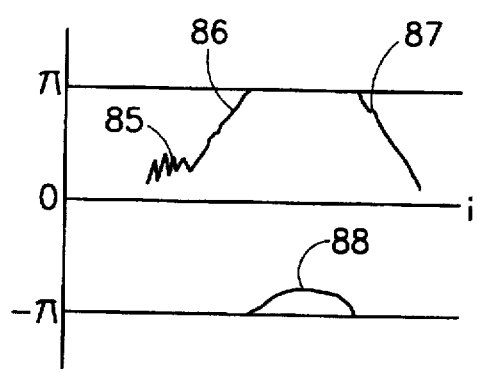
FIG. 6($a$) shows noise and phase wrap caused "bad" regions and a "good" region in the pixels of the original acquired image.

FIG. 6(a) shows a one dimensional (1D) example which shows bad regions at 85, 86 and 89 where the phase variation is too large (85) and due to a $2\pi$ phase jump 86 and 87. the good region 88 is not too noisy and has phase variations that are not too large.

Figure 6B:
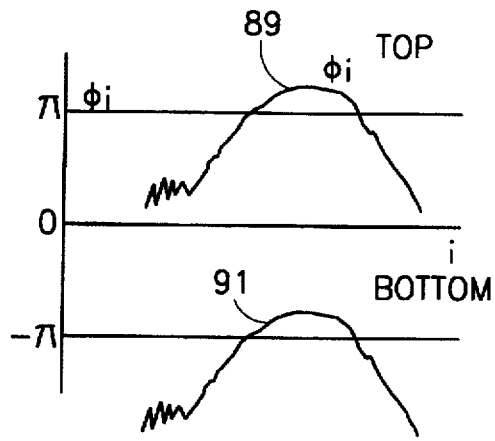

FIG. 6(b) shows ideal $\phi$i unwrapping at the top 89 or the bottom 91.

Figure 6C:
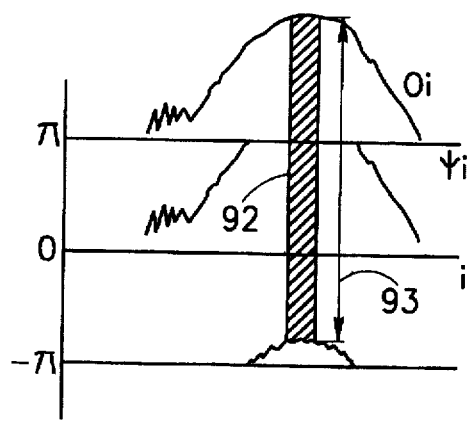

FIG. 6(c) shows the bias region 92 found in the search and the calculated difference 93.

Figure 6D:
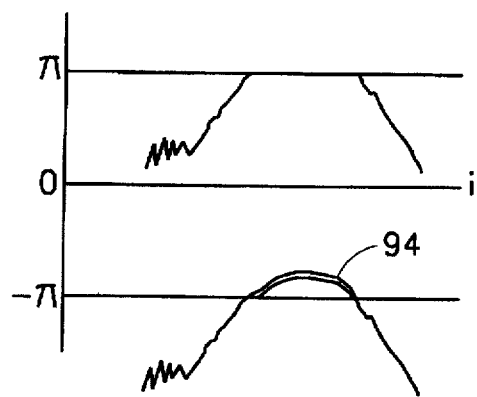

FIG. 6(d) shows the difference calculated from $\phi$'i 94 to provide the constant removed $\phi$i.

Figure 7:
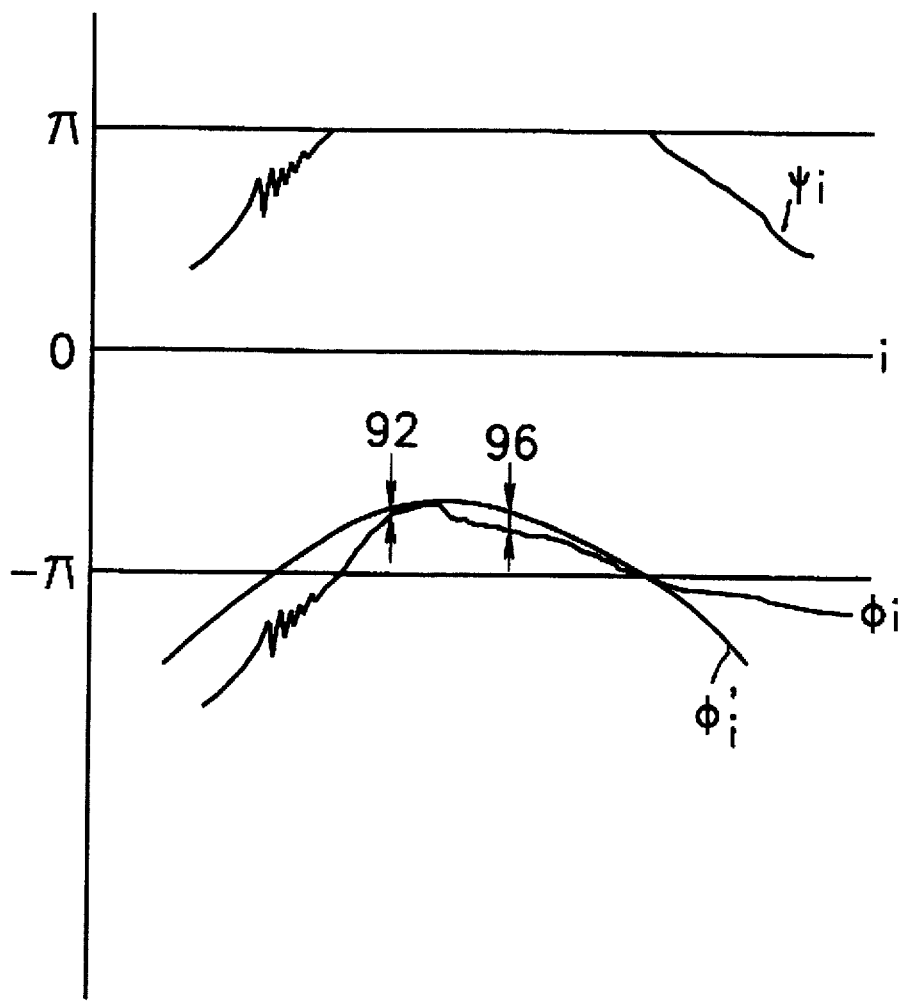
FIG. 7 shows that after a small number of iterations and after the constant is removed, the fitted phase may still not be close enough to the true phase.

FIG. 7 shows the fitted phase $\phi$'i after a few iterations and removal of the constant. At the bias region 92 the fit is close but in regions removed from the bias region the fit is not close enough. Instead of continuing to do iterations an alternative process is to find the difference 96 between $\phi$i and $\phi$i for each i (pixel), if the difference is smaller than $\pm\pi$ make it equal to the value of $\psi$.

If $\pi < \text{dif} < 3\pi$ set the output to $\phi i = \psi i + 2\pi$.

If $-\pi < \text{dif} < -3\pi$ set the output to $\phi i = \psi i - 2\pi$.

Generally if:

$(2n-1)\pi < \text{dif} < (2n-1)\pi$, make the output $\phi i = \psi i + 2n\pi$ $-(2n-1)\pi < \text{dif} < -(2n-1)\pi$, make the output $\phi i = \psi i - 2n\pi$ where n is a positive integer Thus, a system for obtaining robust on-line phase unwrapping is provided for use in spectral component separation during magnetic resonance imaging.

While the invention has been described using some specific examples, it should be understood that these examples are not to be construed as limitations on the scope of the invention which is defined by the claims that follow:

What is claimed is:

1. A method of using magnetic resonance imaging (MRI) systems for acquiring separate data contributions in images derived from first and second spectral components, the method comprising the steps of:

acquiring two complex images, the first of said two complex images including said first and said second spectral components in-phase, the second of said two complex images including said first and said second spectral components out-of-phase, generating a wrapped phase map from said two complex images, unwrapping the phase of the wrapped phase map, said step of unwrapping the phase comprising the steps of:

solving the Poisson equation with a weighting map to derive an unwrapped phase map, using the unwrapped phase map to correct the phase of the complex image with the spectral components out-of-phase, using the image with the corrected phase to obtain a plus image and a minus image, and distinguishing between the plus and the minus images to determine which is the image of the first spectral component and which is the image of the second spectral component.

2. The method of claim 1 for separating spectral components wherein said first spectral components are water and said second spectral components are lipids.

3. The method of claim 1 wherein the unwrapped phase map includes a bias for all of the pixels and the step of removing the bias to determine a true unwrapped phase map, using said true unwrapped phase map to correct the phase of the complex image with the spectral components out-of-phase.

4. The system of claim 3 wherein the step of removing the bias comprises the steps of:

determining the bias per pixel, finding a region of the first image with said first and second spectral components in-phase that is a "good" region which includes only the bias, and using the determined bias to remove the bias from the unwrapped phase map.

5. A method for unwrapping phase for use in magnetic resonance imaging systems that acquire images of first and second spectral components, said method comprising the steps of:

acquiring an in-phase image and out-of-phase image with the in-phase image having first and second spectral components in-phase and the out-of-phase image having first and second spectral components out-of-phase, generating a wrapped phase map showing the phase per pixel caused by main static magnetic field (Bo) inhomogeneity, said wrapped phase map including pixels with wrapped phase values, performing phase unwrapping by solving Poisson's equation, said performing step including:

solving the Poisson's equation with a weighted iterative algorithm using a weighting map, setting up a weighting map based on a signal-to-noise ratio and phase differentiation of the phase map, the solution to the Poisson equation including an unwrapped phase map that has a constant per pixel, removing the constant, using the unwrapped phase map with the constant removed to obtain a phase-corrected complex image with the first and second spectral components out-of-phase, obtaining a plus image by adding the phase corrected image and the in-phase image, obtaining a minus image by subtracting the phase-corrected image from the in-phase image, and determining which image of the plus and minus images is the image of the first spectral component.

6. The method of claim 5 including the step of combining the minus image and the plus image to obtain an image free of inhomogeneity and chemical phase shift artifacts.

7. The method of claim 5 wherein the first and second spectral components are water and lipid respectively.

\* \* \* \* \*